(12) United States Patent
Shim et al.

(10) Patent No.: US 10,367,039 B2
(45) Date of Patent: Jul. 30, 2019

(54) DISPLAY DEVICE HAVING AREAS

(71) Applicant: LG Display Co., Ltd., Seoul (KR)

(72) Inventors: Sung-Bin Shim, Yangsan-si (KR);
Ho-Won Choi, Paju-si (KR); Eui-Doo Do, Paju-si (KR); Moon-Bae Gee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/791,273

(22) Filed: Oct. 23, 2017

(65) Prior Publication Data

US 2018/0122861 A1    May 3, 2018

(30) Foreign Application Priority Data

Oct. 31, 2016  (KR) .................. 10-2016-0143897

(51) Int. Cl.
  *H01L 29/08*     (2006.01)
  *H01L 27/32*     (2006.01)
  *H01L 51/50*     (2006.01)

(52) U.S. Cl.
  CPC ........ *H01L 27/322* (2013.01); *H01L 27/3213* (2013.01); *H01L 27/3248* (2013.01); *H01L 27/3258* (2013.01); *H01L 51/508* (2013.01); *H01L 51/5064* (2013.01); *H01L 2251/558* (2013.01)

(58) Field of Classification Search
  CPC .... H01L 27/15; H01L 27/322; H01L 27/3213
  USPC .......................................................... 257/40
  See application file for complete search history.

(56) References Cited

U.S. PATENT DOCUMENTS

| 7,268,490 | B2 | 9/2007 | Oota |
| 8,581,273 | B2 | 11/2013 | Takei |
| 9,722,007 | B2 | 8/2017 | Kim et al. |
| 2006/0290274 | A1 | 12/2006 | Oota |
| 2012/0001185 | A1 | 1/2012 | Lee et al. |
| 2012/0305952 | A1 | 12/2012 | Takei |
| 2012/0305953 | A1 | 12/2012 | Bertram et al. |
| 2014/0239266 | A1 | 8/2014 | Kim |
| 2014/0306246 | A1* | 10/2014 | Chen ................. H01L 24/14 257/88 |
| 2014/0363913 | A1* | 12/2014 | Park ................... H01L 51/5064 438/35 |

(Continued)

FOREIGN PATENT DOCUMENTS

| JP | 2000-137242 A | 5/2000 |
| JP | 2003-167262 A | 6/2003 |

(Continued)

OTHER PUBLICATIONS

European Patent Office, Extended European Search report and Opinion, EP Patent Application No. 17199471.8, dated Apr. 5, 2018, ten pages.

(Continued)

*Primary Examiner* — Caleb E Henry
(74) *Attorney, Agent, or Firm* — Fenwick & West LLP

(57) ABSTRACT

A display device including emitting areas is provided. The emitting areas of the display device may realize a different color each other. The display device includes light-emitting structures on the emitting areas. The adjacent light-emitting structures have different heights with respect to the lower substrate, such that a size of a non-emitting area between the adjacent emitting areas is reduced.

20 Claims, 4 Drawing Sheets

(56) References Cited

U.S. PATENT DOCUMENTS

| | | | |
|---|---|---|---|
| 2015/0348949 A1* | 12/2015 | Kobayakawa | H01L 33/54 257/88 |
| 2016/0155892 A1* | 6/2016 | Li | H01L 24/00 257/89 |
| 2016/0190213 A1 | 6/2016 | Kim et al. | |
| 2016/0240591 A1* | 8/2016 | Song | H01L 27/3211 |

FOREIGN PATENT DOCUMENTS

| | | |
|---|---|---|
| JP | 2007-005173 A | 1/2007 |
| JP | 2009-071019 A | 4/2009 |
| JP | 2012-252783 A | 12/2012 |
| JP | 2012-255825 A | 12/2012 |
| JP | 2014-134659 A | 7/2014 |
| JP | 2016-127003 A | 7/2016 |
| KR | 10-2015-0038982 A | 4/2015 |

OTHER PUBLICATIONS

Japan Patent Office, Notification of Reasons for Refusal, JP Patent Application No. 2017-205950, dated Oct. 30, 2018, ten pages.

* cited by examiner

DISPLAY DEVICE HAVING AREAS

This application claims the priority benefit of Korean Patent Application No. 10-2016-0143897, filed on Oct. 31, 2016, which is hereby incorporated by reference as if fully set forth herein.

BACKGROUND

Field of the Invention

The present disclosure relates to a display device including emitting areas which realize a different color, each other.

Discussion of the Related Art

Generally, electronic appliance, such as a monitor, a TV, a laptop computer, and a digital camera, include a display device to realize an image. For example, the display device may include a liquid crystal display device and an organic light-emitting display device.

The display device may include emitting areas which realize a different color each other. For example, the display device may include a blue emitting area realizing blue color, a red emitting area realizing red color, a green emitting area realizing green color, and a white emitting area realizing white color.

On the respective emitting areas of the display device, a light-emitting structure generating a light which realizes a specific color may be disposed. For example, each of the light-emitting structure may include a lower electrode, a light-emitting layer and an upper electrode, which are sequentially stacked. The adjacent light-emitting structures may be controlled independently. For example, a lower electrode of each light-emitting structure may be spaced apart and insulated from a lower electrode of a light-emitting structure on the adjacent emitting area.

In the display device, a distance between the adjacent emitting areas may be inversely proportional to the resolution. For example, the display device may realize a high-resolution by reducing a size and an area of a non-emitting area between the adjacent emitting areas. However, a horizontal distance between the adjacent emitting areas must be maintained at a predetermined value in order to sufficiently insulate between lower electrodes of the adjacent light-emitting structures. Thus, the display device has a limitation in reducing the size and the area of the non-emitting area in order to increase the resolution.

SUMMARY

Accordingly, the present disclosure is directed to a display device having emitting areas that substantially obviates one or more problems due to limitations and disadvantages of the related art.

One objective of the present disclosure is to provide a display device capable of reducing a size and an area of a non-emitting area to a minimum insulating distance between the adjacent light-emitting structures.

Another objective of the present disclosure is to provide a display device in which the adjacent light-emitting structures may be sufficiently insulated even a short horizontal distance.

Additional advantages, objectives, and features of the disclosure will be set forth in part in the description which follows and in part will become apparent to those having ordinary skill in the art upon examination of the following or may be learned from practice of the disclosed principles. The objectives and other advantages of the disclosure may be realized and attained by the structure particularly pointed out in the written description and claims hereof as well as the appended drawings.

To achieve these objectives and other advantages and in accordance with the purpose of the present disclosure, as embodied and broadly described herein, there is provided a display device including a first light-emitting structure on a first emitting area of a lower substrate and a second light-emitting structure on a second emitting area of the lower substrate. The second emitting area of the lower substrate corresponds to a color different from the first emitting area of the lower substrate. A vertical distance between the lower substrate and the second light-emitting structure is large than a vertical distance between the lower substrate and the first light-emitting structure.

A thickness of the second light-emitting structure may be same as a thickness of the first light-emitting structure.

A third light-emitting structure may be disposed on a third emitting area of the lower substrate. The third emitting area of the lower substrate may correspond to a color different from the first emitting area and the second emitting area of the lower substrate. A vertical distance between the lower substrate and the third light-emitting structure may be same as the vertical distance between the lower substrate and the first light-emitting structure.

The second emitting area may be disposed between the first emitting area and the third emitting area.

A lower insulating layer may be disposed between the lower substrate and the first light-emitting structure. The lower insulating layer may extend between the lower substrate and the second light-emitting structure. An upper insulating layer may be disposed between the lower insulating layer and the second light-emitting structure.

The upper insulating layer may include a material different from the lower insulating layer.

The lower insulating layer may include a first lower contact hole and a second lower contact hole. A lower electrode of the first light-emitting structure may extend into the first lower contact hole of the lower insulating layer. A lower electrode of the second light-emitting structure may extend into the second lower contact hole of the lower insulating layer. A size of the second lower contact hole at an upper surface of the lower insulating layer may be larger than a size of the first lower contact hole at the upper surface of the lower insulating layer.

The upper insulating layer may cover an edge of the lower electrode of the first light-emitting structure.

The upper insulating layer may extend into the second lower contact hole.

The upper insulating layer may include an upper contact hole filled by the lower electrode of the second light-emitting structure. The upper contact hole may be aligned to the second lower contact hole.

In accordance with another aspect of the present disclosure, there is provided a display device including a lower over-coat layer on a lower substrate. First light-emitting structures are disposed on the lower over-coat layer. The first light-emitting structures are spaced apart from each other. An upper over-coat layer is disposed between the first light-emitting structures. Second light-emitting structures are disposed on the upper over-coat layer.

The upper over-coat layer may include a same material as the lower over-coat layer.

A side of the upper over-coat layer may have a reverse taper.

Each of the first light-emitting structures may be defined by a first lower electrode, a first light-emitting layer and a first upper electrode. Each of the second light-emitting structures may be defined by a second lower electrode, a second light-emitting layer and a second upper electrode. The second lower electrode may be made of the same material as the first lower electrode, the second light-emitting layer may be made of the same material as the first light-emitting layer, and the second upper electrode may be made of the same material as the first upper electrode.

The second lower electrode may be spaced apart from the first lower electrode, and the second light-emitting layer may be spaced apart from the first light-emitting layer.

A first penetrating hole overlapping with the first light-emitting structure may penetrate the lower over-coat layer. A second penetrating hole overlapping with the second light-emitting structure may penetrate the lower over-coat layer and the upper over-coat layer. The first penetrating hole and the second penetrating hole may be reverse tapered.

A first intermediate insulating layer may be disposed on the inside of the first penetrating hole. The first intermediate insulating layer may include a first contact hole. A second intermediate insulating layer may be disposed on the inside of the second penetrating hole. The second intermediate insulating layer may include a second contact hole. A side of the first contact hole and a side of the second contact hole may have a positive taper.

In accordance with another aspect of the present disclosure, there is provided a display device including a lower substrate, a first light-emitting device for producing a first color, a second light-emitting device for producing a second color, an insulating structure between the first and second light-emitting structures, a third light-emitting device on the insulating structure, and an insulating layer. The third light-emitting device produces a color different than the first color and the second color. The insulating layer is on the lower substrate and is below the first, second, and third light-emitting devices.

The first light-emitting device includes a first lower electrode on the insulating layer. The third light-emitting device includes a third lower electrode on the insulating structure. The upper surface of the first lower electrode is closed to the upper surface of the lower substrate than the upper surface of the third lower electrode.

The first light-emitting device includes a first lower electrode on the insulating layer, and the second light-emitting device includes a second lower electrode on the insulating layer. The distance between the upper surface of the first lower electrode and the upper surface of the lower substrate is the same as the distance between the upper surface of the lower substrate.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
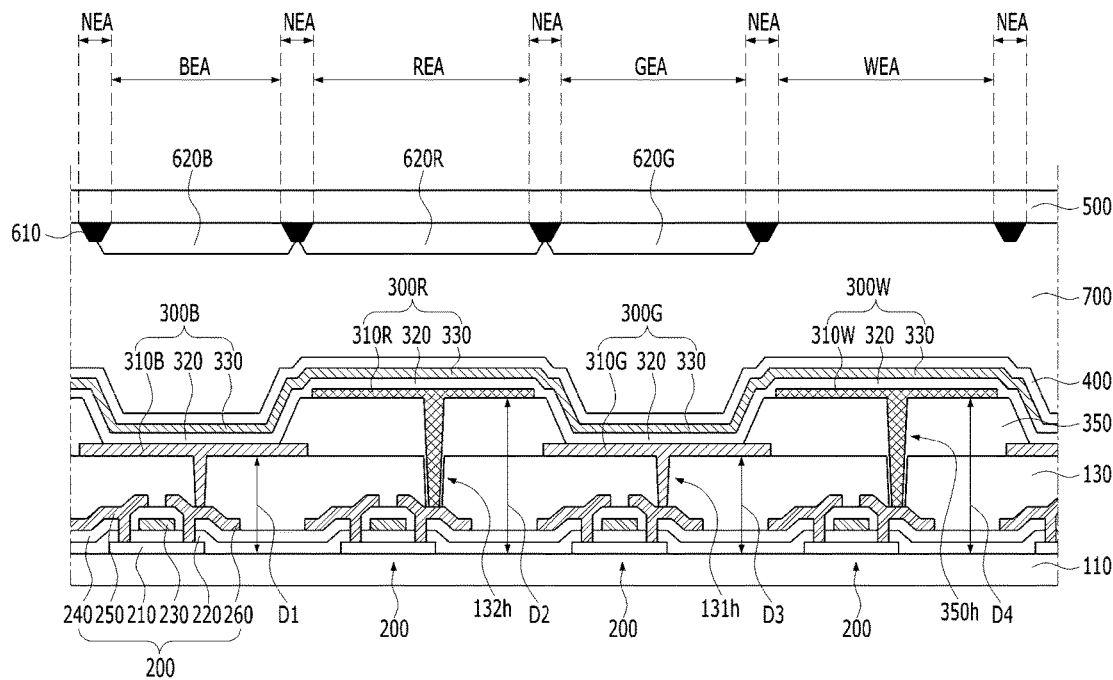
FIG. 1 is a view schematically showing a display device according to an embodiment.

Hereinafter, details related to the above objectives, technical configurations, and operational effects of the embodiments of the present invention will be clearly understood by the following detailed description with reference to the drawings, which illustrate various embodiments. Here, the various embodiments are provided in order to allow the technical sprit of the present disclosure to be satisfactorily transferred to those skilled in the art, and thus the present invention may be embodied in other forms and is not limited to the embodiments described below.

In addition, the same or similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Some of the advantages of the present disclosure include (1) providing a display device capable of reducing a size and an area of a non-emitting area between the adjacent light-emitting structures by obviating bank layers between the light-emitting structures.

Another objective of the present disclosure is to provide a display device in which the adjacent light-emitting structures may be sufficiently insulated even a short horizontal distance.

FIG. 1 is a view schematically showing a display device according to an embodiment.

Referring to FIG. 1, the display device according to the embodiment may comprise a lower substrate 110, an over-coat layer 130, thin film transistors 200, light-emitting structures 300B, 300R, 300G and 300W, and a insulating layer 350.

The lower substrate 110 may support the thin-film transistors 200 and the light-emitting structures 300B, 300R, 300G and 300W. The lower substrate 110 may include an insulating material. For example, the lower substrate 110 may include glass or plastic.

The lower substrate 110 may include emitting areas BEA, REA, GEA and WEA, and non-emitting areas NEA. The non-emitting areas NEA may be disposed between the emitting areas BEA, REA, GEA and WEA. The emitting areas BEA, REA, GEA and WEA may be separated by the non-emitting areas NEA.

The lower substrate 110 may include the emitting areas BEA, REA, GEA and WEA which are a different color from each other. For example, the lower substrate 110 may include a blue emitting area BEA realizing blue color, a red emitting area REA realizing red color, a green emitting area GEA realizing green color, and a white emitting area WEA realizing white color. The emitting areas BEA, REA, GEA and WEA may have a same horizontal distance.

The thin film transistors 200 may be disposed on the lower substrate 110. For example, each of the thin film transistors 200 may include a semiconductor pattern 210, a gate insulating layer 220, a gate electrode 230, an interlayer insulating layer 240, a source electrode 250, and a drain electrode 260.

The semiconductor pattern 210 may be disposed close to the lower substrate 110. The semiconductor pattern 210 may include a semiconductor material. For example, the semiconductor pattern 210 may include amorphous silicon or polycrystalline silicon. In some embodiments, the semiconductor pattern 210 may include an oxide semiconductor material, such as IGZO.

The semiconductor pattern 210 may include a source region, a drain region, and a channel region. The channel region may be disposed between the source region and the drain region. The conductivity of the channel region may be smaller than that of the source region and that of the drain region. For example, the source region and the drain region may include a conductive impurity.

The display device according to the embodiment of the present disclosure is described such that the semiconductor patterns 210 of each thin film transistor 200 is in direct contact with the lower substrate 110. However, the display device according to another embodiment may include a buffer layer between the lower substrate 110 and the thin film transistors 200. The buffer layer may include an insulating material. For example, the buffer layer may include silicon oxide.

The gate insulating layer 220 may be disposed on the semiconductor pattern 210. The gate insulating layer 220 may extend to the outside of the semiconductor pattern 210. In some embodiments, the gate insulating layer 220 of each thin film transistor 200 may be connected to each other. The gate insulating layer 220 may include an insulating material. For example, the gate insulating layer 220 may include silicon oxide and/or silicon nitride. In some embodiments, The gate insulating layer 220 may include a High-K material. For example, the gate insulating layer 220 may include hafnium oxide (HfO) or titanium oxide (TiO). The gate insulating layer may be a multi-layer structure.

The gate electrode 230 may be disposed on the gate insulating layer 220. The gate electrode 230 may overlap the channel region of the semiconductor pattern 210. The gate electrode 230 may include a conductive material. For example, the gate electrode 230 may include a metal, such as aluminum (Al), chromium (Cr), molybdenum (Mo), and tungsten (W).

The interlayer insulating layer 240 may be disposed on the gate insulating layer 220 and the gate electrode 230. The gate electrode 230 may be completely covered by the interlayer insulating layer 240. The interlayer insulating layer 240 may extend to the outside of the semiconductor pattern 210. In some embodiments, the interlayer insulating layer 240 of each thin film transistor 200 may be connected to each other. The interlayer insulating layer 240 may include an insulating material. For example, the interlayer insulating layer 240 may include silicon oxide and/or silicon nitride. The interlayer insulating layer may be a multi-layer structure.

The source electrode 250 and the drain electrode 260 may be disposed on the interlayer insulating layer 240. The source electrode 250 may be electrically connected to the source area of the semiconductor pattern 210. The drain electrode 260 may be electrically connected to the drain area of the semiconductor pattern 210. For example, the gate insulating layer 220 and the interlayer insulating layer 240 may include contact holes exposing the source area of the semiconductor pattern 210 of each thin film transistor 200, and contact holes exposing the drain area of the semiconductor pattern 210 of each thin film transistor 200. The drain electrode 260 may be spaced apart from the source electrode 250.

The source electrode 250 and the drain electrode 260 may include a conductive material. For example, the source electrode 250 and the drain electrode 260 may include a metal, such as aluminum (Al), chromium (Cr), molybdenum (Mo), and tungsten (W). The drain electrode 260 may include the same material as the source electrode 250. For example, the drain electrode 260 may be formed by the same etching process as the source electrode 250. The gate electrode 230 may be a material different from the source electrode 250 and the drain electrode 260.

The display device according to the embodiment is described such that the semiconductor pattern 210 of each thin film transistor 200 is disposed between the lower substrate 110 and the corresponding gate electrode 230. However, in the display device according to another embodiment, each of the thin film transistors 200 may include the gate electrode 230 between the lower substrate 110 and the corresponding semiconductor pattern 210.

The over-coat layers 130 may be disposed on the thin film transistors 200. The over-coat layer 130 may remove a thickness difference by the thin film transistors 200. The over-coat layer 130 may include an insulating material. For example, the over-coat layer 130 may include an organic insulating material.

The display device according to the embodiment is described such that the thin film transistors 200 is in direct contact with the over-coat layer 130. However, the display device according to another embodiment may further include a lower passivation layer between the thin film transistors 200 and the over-coat layer 130. The lower passivation layer may include an insulating material. The lower passivation layer may include a material different from the over-coat layer 130. For example, the lower passivation layer may include silicon oxide and/or silicon nitride. The lower passivation layer may be multi-layer structure.

The light-emitting structures 300B, 300R, 300G and 300W may realize a specific color, respectively. For example, each of the light-emitting structures 300B, 300R, 300G and 300W may include a lower electrode 310B, 310R, 310G and 310W, a light-emitting layer 320, and an upper electrode 330, which are sequentially stacked.

Each of the light-emitting structures 300B, 300R, 300G and 300W may overlap one of the emitting areas BEA, REA, GEA and WEA of the lower substrate 110. The light-emitting structures 300B, 300R, 300G and 300W may include a blue light-emitting structure 300B overlapping with the blue emitting area BEA, a red light-emitting structure 300R overlapping with the red emitting area REA, a green light-emitting structure 300G overlapping with the green emitting area GEA and a white light-emitting structure 300W overlapping with the white emitting area WEA.

The light-emitting structures 300B, 300R, 300G and 300W may be selectively driven by the thin film transistors 200. For example, the lower electrode of each the light-emitting structure 300B, 300R, 300G and 300W may be electrically connected to the drain electrode 260 of one of the thin film transistors 200. The light-emitting structures 300B, 300R, 300G and 300W may be disposed on the over-coat layer 130. The over-coat layer 130 may include contact holes 131h and 132h in which the lower electrode 310B, 310R, 310G and 310W of each light-emitting structure 300B, 300R, 300G and 300W may extend.

The lower electrode 310B, 310R, 310G and 310W may include a high-reflective material. For example, the lower electrode 310B, 310R, 310G and 310W may include a metal, such as aluminum (Al) and silver (Ag). The lower electrode 310B, 310R, 310G and 310W may be multi-layer structure. For example, the lower electrode 310B, 310R, 310G and 310W may be a structure in which a reflective electrode including a high-reflective material is disposed between transparent electrodes including a transparent conductive material, such as indium tin oxide (ITO) and indium zinc oxide (IZO).

The light-emitting layer 320 may generate light, the brightness of which corresponds to the voltage difference between the lower electrode 310B, 310R, 310G and 310W and the upper electrode 330 of the corresponding light-emitting structure 300B, 300R, 300G and 300W. For example, the light-emitting layer 320 may include an emitting material layer (EML) having an emission material. The emission material may be an organic material, an inorganic material, or a hybrid material. For example, the display device may be an organic light-emitting display device including a light-emitting layer 320 of an organic material.

The light-emitting layer 320 may be a multi-layer structure in order to increase luminous efficacy. For example, the light-emitting layer 320 may further include at least one of a hole injection layer (HIL), a hole transporting layer (HTL), an electron transporting layer (ETL), and an electron injection layer (EIL).

In the display device according to the embodiment, the light-emitting structures 300B, 300R, 300G and 300W may realize a same color. For example, the light-emitting layer 320 of each the light-emitting structure 300B, 300R, 300G and 300W may extend onto the adjacent emitting area BEA, REA, GEA and WEA. The light-emitting layers 320 of the adjacent light-emitting structure 300B, 300R, 300G and 300W may be connected to each other.

The upper electrode 330 may include a conductive material. The upper electrode 330 may have a structure different from the lower electrode 310B, 310R, 310G and 310W. For example, the upper electrode 330 may be a transparent electrode including a transparent material, such as ITO or IZO. The light generated by the light-emitting layer 320 may emit through the upper electrode 330.

The display device is described such that the light generated by the light-emitting layer 320 passes through the upper electrode 230. However, in the display device according to another embodiment, the light generated by the light-emitting layer 320 may travel toward the outside of the lower substrate 110. Alternatively, in the display device according to another embodiment, the light generated by the light-emitting layer 320 may pass through all of the lower electrode 310B, 310R, 310G and 310W, and the upper electrode 330. For example, the display device according to another embodiment may be a bottom emission type or a both-sides emission type.

The upper electrode 330 may extend along the light-emitting layer 320. For example, the upper electrode 330 of each the light-emitting structure 300B, 300R, 300G and 300W may extend onto the adjacent emitting area BEA, REA, GEA and WEA. The light-emitting structure 300B, 300R, 300G and 300W may include the connected upper electrode 330.

The insulating layer 350 may be disposed on the over-coat layer 130. The insulating layer 350 may be disposed on some of the emitting area BEA, REA, GEA and WEA among the emitting areas BEA, REA, GEA and WEA of the lower substrate 110. For example, the insulating layer 350 may be disposed on one of two adjacent emitting areas BEA, REA, GEA and WEA. For example, the insulating layer 350 may be disposed on the red emitting area REA and the white emitting area WEA among the blue emitting area BEA, the red emitting area REA, the green emitting area GEA and the white emitting area WEA, which are arranged side by side on the lower substrate 110.

The insulating layer 350 may be disposed between the over-coat layer 130 and the corresponding light-emitting structure 300B, 300R, 300G and 300W. For example, the red light-emitting structure 300R and the white light-emitting structure 300W may be disposed on the insulating layer 350. A vertical distance between the lower substrate 110 and the red light-emitting structure 300R or the white light-emitting structure 300W may be larger than a vertical distance between the lower substrate 110 and the blue light-emitting structure 300B or the green light-emitting structure 300G.

In the display device, one of the two adjacent light-emitting structure 300B, 300R, 300G and 300W may be disposed on the insulating layer 350. That is, in the display device according to the embodiment, the two adjacent light-emitting structure 300B, 300R, 300G and 300W may have different heights. Thus, in the display device according to the embodiment of the present invention, the adjacent light-emitting structure 300B, 300R, 300G and 300W may be sufficiently insulated even at a short horizontal distance. Therefore, in the display device according to the embodiment of the present invention, a horizontal distance of the non-emitting area NEA between the adjacent emitting area BEA, REA, GEA and WEA may be reduced.

The insulating layer 350 may include an insulating material. For example, the insulating layer 350 may include an organic insulating material, such as benzocyclobutene (BCB), polyimide and photoacryl. The insulating layer 350 may include a material different from the over-coat layer 130.

The insulating layer 350 may cover edges of the lower electrodes 310B, 310R, 310G and 310W on the emitting area BEA, REA, GEA and WEA which are disposed adjacent the corresponding emitting area BEA, REA, GEA and WEA. For example, the insulating layer 350 may cover an edge of the lower electrode 310B of the blue light-emitting structure 300B and an edge of the lower electrode 310G of the green light-emitting structure 300G.

The lower electrodes 310B, 310R, 310G and 310W of the light-emitting structures 300B, 300R, 300G and 300W on the insulating layer 350 may be formed by a process different from the lower electrodes 310B, 310R, 310G and 310W of the light-emitting structures 300B, 300R, 300G and 300W between the insulating layer 350. For example, a process of forming the lower electrode 310R of the red light-emitting structure 300R and the lower electrode 310W of the white light-emitting structure 300W may be performed independently of a process of forming the lower electrode 310B of the blue light-emitting structure 300B and the lower electrode 310G of the green light-emitting structure 300G. The lower electrode 310R of the red light-emitting structure 300R and the lower electrode 310W of the white light-emitting structure 300W may be a shape different from the lower electrode 310B of the blue light-emitting structure 300B and the lower electrode 310G of the green light-emitting structure 300G.

The process of forming the lower electrodes 310B, 310R, 310G and 310W of the light-emitting structures 300B, 300R, 300G and 300W on the insulating layer 350 may be performed in the same manner as the process of forming the lower electrodes 310B, 310R, 310G and 310W of the light-emitting structures 300B, 300R, 300G and 300W between the insulating layer 350. For example, the lower electrode 310R of the red light-emitting structure 300R and the lower electrode 310W of the white light-emitting structure 300W may have a same structure as the lower electrode 310B of the blue light-emitting structure 300B and the lower electrode 310G of the green light-emitting structure 300B. A vertical distance of the red light-emitting structure 300R and a vertical distance of the white light-emitting structure 300W may be same as a vertical distance of the blue light-emitting structure 300B and a vertical distance of the green light-emitting structure 300G. In some embodiments, the lower electrode 310R of the red light-emitting structure 300R and the lower electrode 310W of the white light-emitting structure 300W may include a same material as the lower electrode 310B of the blue light-emitting structure 300B and the lower electrode 310G of the green light-emitting structure 300B.

The insulating layer 350 may include a contact hole 350h in which the lower electrode 310B, 310R, 310G and 310W of the corresponding light-emitting structure 300B, 300R, 300G and 300W extends. The contact hole 350h may penetrate the over-coat layer 130. In some embodiments, the over-coat layer 130 may include a first over contact hole 131h on the emitting area BEA, REA, GEA and WEA on which the insulating layer 350 is not formed, and a second over contact hole 132h on the emitting area BEA, REA, GEA and WEA on which the insulating layer 350 is formed. The contact hole 350h may be aligned with the second over contact hole 132h.

The contact hole 350h may extend to the inside of the second over contact hole 132h. A lower end of the contact hole 350h may be disposed on the inside of the second over contact hole 132h. A size of the contact hole 350h may be same as a size of the first over contact hole 131h. For example, a size of the second over contact hole 132h may be larger than the size of the first over contact hole 131h. The insulating layer 350 may extend on a side of the second over contact hole 132h of the over-coat layer 130.

The display device may further include a device passivation layer 400 on the light-emitting structures 300B, 300R, 300G and 300W. The device passivation layer 400 may protect the light-emitting structures 300B, 300R, 300G and 300W from the exterior impact and moisture. The device passivation layer 400 may include an insulating material. For example, the device passivation layer 400 may include silicon oxide and/or silicon nitride. The device passivation layer 400 may be multi-layer structure.

The display device may further comprise an upper substrate 500 on the device passivation layer 400. The upper substrate 500 may be disposed opposite the lower substrate 110. The upper substrate 500 may include an insulating material. The upper substrate 500 may include a transparent material. For example, the upper substrate 500 may include glass or plastic.

A black matrix 610 and color filters 620B, 620R and 620G may be disposed on the upper substrate 500. The black matrix 610 may overlap the non-emitting area NEA of the lower substrate 110. The color filters 620B, 620R and 620G may be disposed between the black matrix 610. The color filters 620B, 620R and 620G may overlap the emitting area BEA, REA, GEA and WEA of the lower substrate 110. For example, the color filters 620B, 620R and 620G may include a blue color filter 620B overlapping with the blue emitting area BEA, a red color filter 620R overlapping with the red emitting area REA and a green color filter 620G overlapping with the green emitting area GEA. The color filters 620B, 620R and 620G may be not disposed on a surface of the upper substrate 500 overlapping with the white emitting area WEA of the lower substrate 110. The upper substrate 500 may be bonded to the lower substrate 110 by an adhesive layer 700.

Accordingly, in the display device according to the embodiment of the present invention, because adjacent two light-emitting structures 300B, 300R, 300G and 300W may be sufficiently insulated at a short distance by the adjacent two light-emitting structures 300B, 300R, 300G and 300W have different vertical distances from a lower substrate 110, a horizontal distance of a non-emitting area NEA between adjacent emitting areas BEA, REA, GEA and WEA.

Figure 2:
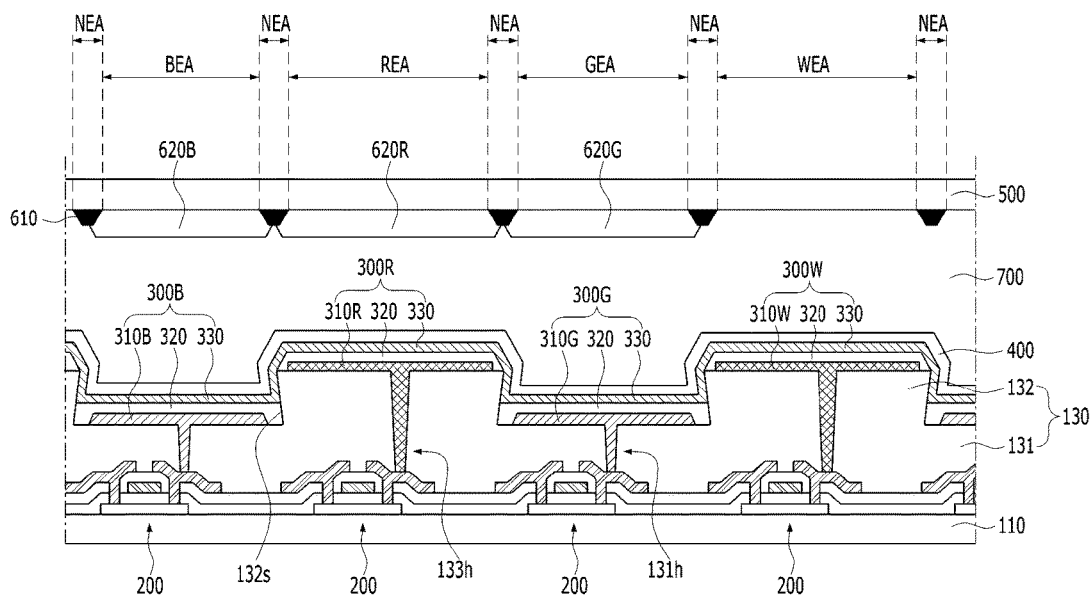
FIGS. 2 to 4 are views respectively showing various examples of a display device according to various embodiment.

The display device is described such that locations of the adjacent two light-emitting structures 300B, 300R, 300G and 300W are changed by the insulating layer 350 on the over-coat layer 130. However, the display device according to another embodiment may use the over-coat layer 130 to make the adjacent two light-emitting structures 300B, 300R, 300G and 300W be on different locations. For example, the display device according to another embodiment may include the over-coat layer 130 having the lower over-coat layer 131 and the upper over-coat layers 132 protruding from the lower over-coat layer 131, as shown in FIG. 2. The upper over-coat layers 132 may be spaced apart from each other. For example, in the display device according to another embodiment, the over-coat layer 130 including the lower over-coat layer 131 and the upper over-coat layer 132 may be formed by partially etching an organic insulating layer covering the thin film transistors 120. The upper over-coat layers 132 may include a same material as the lower over-coat layer 131.

In the display device according to another embodiment, sides 132s of the upper over-coat layers 132 may have a reverse taper. Since the light-emitting layer 320 of each light-emitting structure 300B, 300R, 300G and 300W is formed by the deposition process using evaporation, the light-emitting layer 320 may be not formed on the sides 132s of the upper over-coat layers 132 which have a reverse taper. Thus, in the display device according to another embodiment, the adjacent light-emitting structures 300B, 300R, 300G and 300W may include the light-emitting layer 320 separated from each other. In addition, in the display device according to another embodiment, the lower electrodes 310B, 310R, 310G and 310W may be formed by the deposition process using evaporation, so that the lower electrodes 310B, 310R, 310G and 310W on the emitting areas BEA, REA, GEA and WEA which are insulated from the adjacent emitting areas BEA, REA, GEA and WEA may be formed without patterning process. Therefore, in the display device according to another embodiment, since the lower electrode 310B, 310R, 310G and 310W, the light-emitting layer 320 and the upper electrode 330 of each light-emitting structure 300B, 300R, 300G and 300W may be formed while maintaining a vacuum state in single process chamber, a process time may be greatly reduced. Also, in the display device according to another embodiment, since a wide variety of material is used as the lower electrode due to the lower electrodes are formed without patterning process, a subsequent process, for example a repair process may easily proceed.

The display device according to another embodiment is described such that the upper over-coat layer 132 of the over-coat layer 130 includes the same material as the lower over-coat layer 131. However, the display device according to yet another embodiment may include the upper over-coat layer 133 which includes a material or a physical characteristic different from the lower over-coat layer 131. For example, the display device may include the over-coat layer 130 which is formed by a process of forming the upper over-coat layer 133 including a side 133s which has a reverse taper by patterning an organic insulating layer formed on the lower over-coat layer 131 including the contact holes 131h and 134h. Thus, in the display device, the relationship between the contact holes 131h and 134h of the lower over-coat layer 131 and the contact hole 135h of the upper over-coat layer 133 may be the same as that of the display device according to the embodiment shown in FIG. 1.

Figure 4:
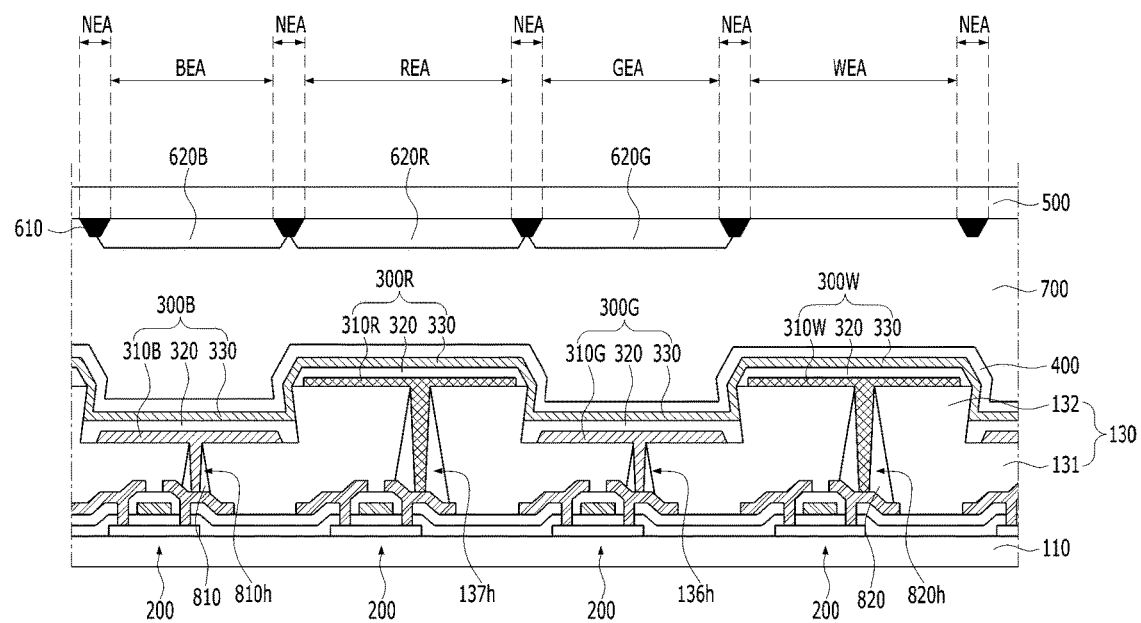

The display device according to the embodiments is described such that a side of the upper over-coat layer 132 or 133 has a reverse taper, and a side of each contact hole has a positive taper. However, in the display device according to another embodiment, the over-coat layer 130 may include contact holes 136h and 137h having a reverse taper, as shown in FIG. 4. The display device according to another embodiment may further comprise intermediate insulating layers 810 and 820 on the inside of the contact holes 136h and 137h of the over-coat layer 130. During the fabrication process, each of the contact holes of a reverse tapered shape is filled with the intermediate insulating material. Then, a hole is formed in the intermediate insulating material to form the lower portion of the lower electrode. In this way, the lower portion of the lower electrode be of a positive tapered shape. This is advantageous among other reasons because it can be ensured that the lower portion does not come in contact with one terminal of the TFT, but not the other terminal. Thus, in the display device according to anther embodiment, it may prevent that the electrically connection of the lower electrodes 310B, 310R, 310G and 310W becomes unstable by a process of forming a reverse taper at a side of the upper over-coat layer 132.

Figure 3:
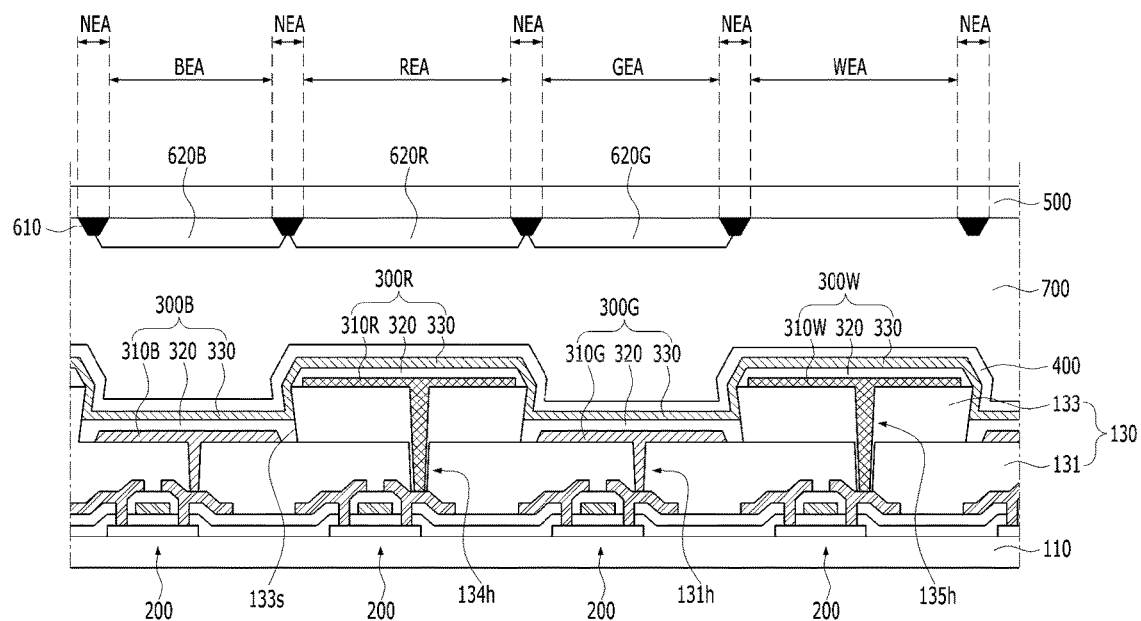
Figure 5A:
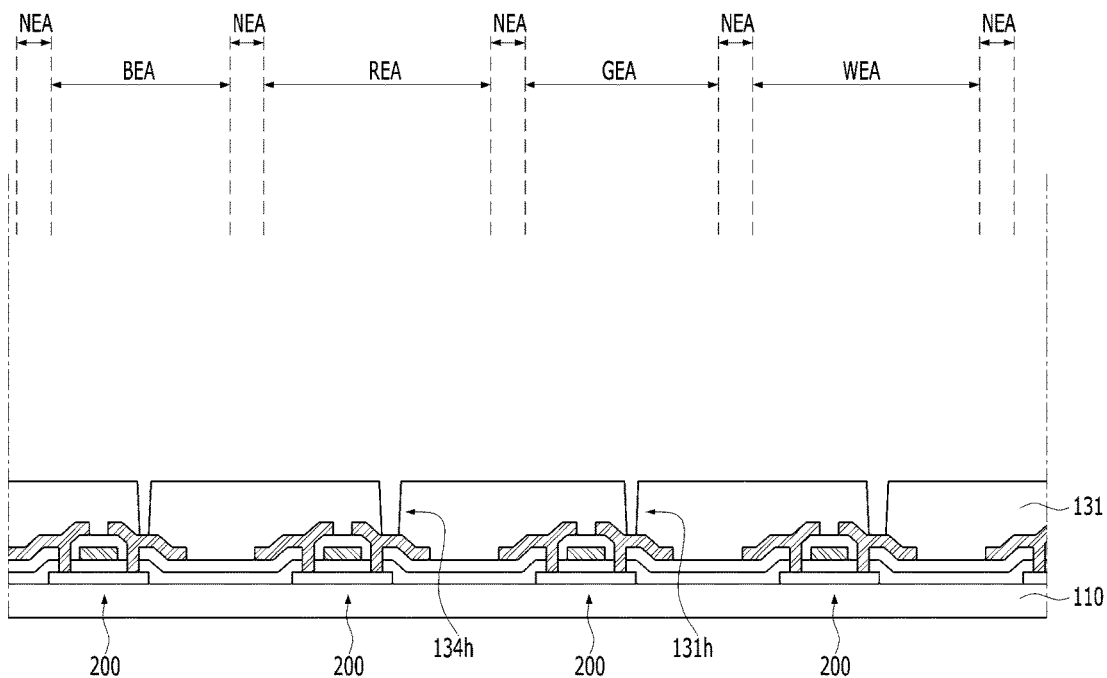
FIGS. 5A to 5C are views sequentially showing a method for forming a display device according to an embodiment.
Figure 5B:
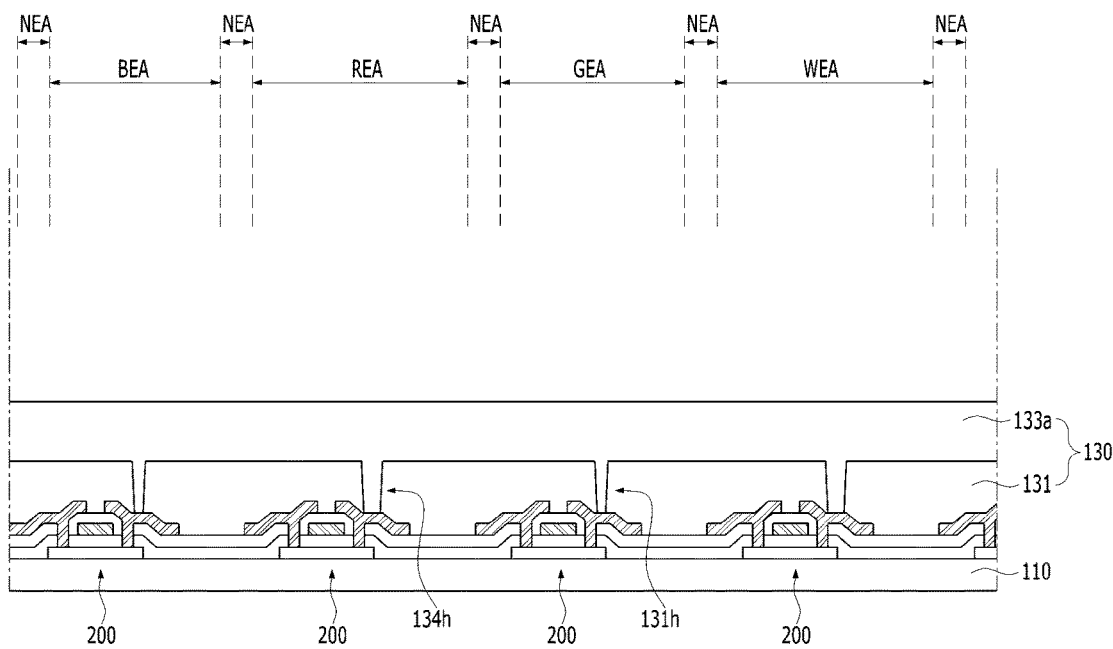
Figure 5C:
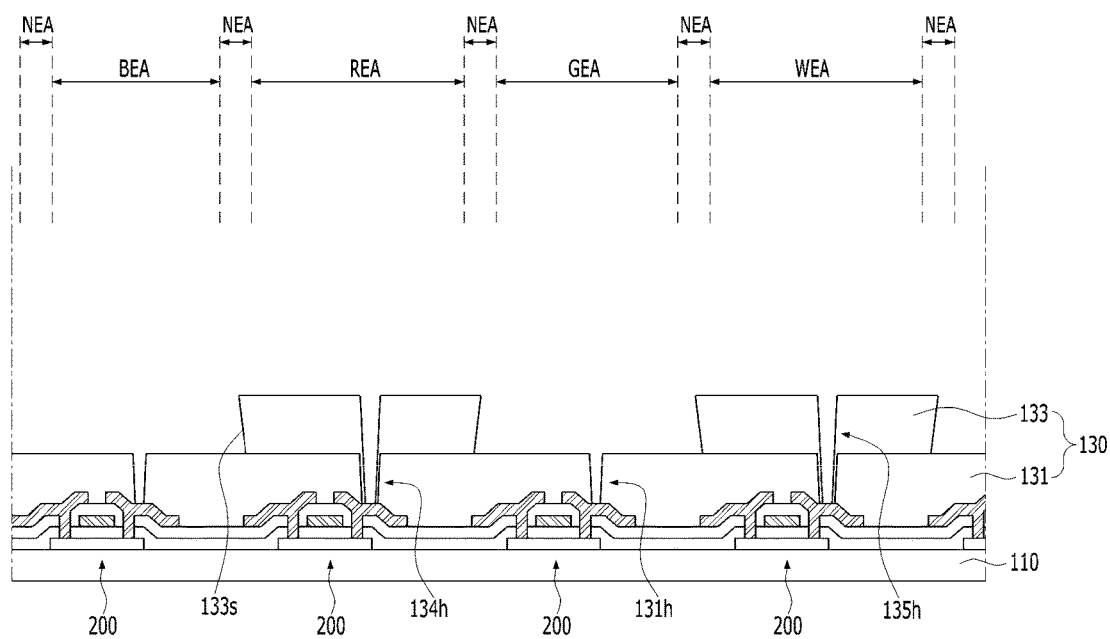

FIGS. 5A to 5C are views sequentially showing a method for forming the display device according to the embodiment shown in FIG. 3.

A method for forming the display device will be described with reference to FIGS. 3 and 5a to 5c. As shown in FIG. 5a, method for forming the display device may include a process of forming thin film transistors 200 on a lower substrate 110, a process of forming lower over-coat layer 131 covering the thin film transistors 200, and a process of forming lower contact holes 131h and 134h in the lower over-coat layer 131.

The lower contact holes 131h and 134h of the lower over-coat layer 131 may be formed to overlap with a corresponding emitting area BEA, REA, GEA and WEA, respectively.

As shown in FIG. 5b, the method for forming the display device may include a process of composing an over-coating layer 130 by forming an organic insulating layer on the lower over-coat layer 131 formed the lower contact holes 131h and 134h.

The organic insulating layer 133a may include the same material as the lower over-coat layer 131. The process of forming the lower contact holes 131h and 134h in the lower over-coat layer 131 may include a curing process. Thus, in the display device, the organic insulating layer 133a may have a physical characteristic different from the lower over-coat layer 131. The organic insulating layer 133a may extend to the inside of the lower contact holes 131h and 134h of the lower over-coat layer 131. The lower contact holes 131h and 134h of the lower over-coat layer 131 may be filled by the organic insulating layer 133a.

As shown in FIG. 5c, the method for forming the display device may include a process of completing an over-coat layer 130 by pattering the organic insulating layer 133a in order to form an upper over-coat layer 133 including a side 133s which has a reverse taper.

The process of completing the over-coat layer 130 may include a process of forming an upper contact hole 135h aligned with the lower contact hole 134h of the lower over-coat layer 131 in the upper over-coat layer 133.

As shown in FIG. 3, the method for forming the display device include a process of forming light-emitting structures 300B, 300R, 300G and 300W on the over-coat layer 130, a process of aligning an upper substrate 500 on which color filters 620B, 620R and 620G are formed on the lower substrate 110 on which the light-emitting structures 300B, 300R, 300G and 300W are formed, and a process of attaching the upper substrate 500 to the lower substrate 110 using an adhesive layer 700.

The process of forming the light-emitting structures 300B, 300R, 300G and 300W may include a process of forming lower electrodes 310B, 310R, 310G and 310W, a process of forming a light-emitting layer 320 separated on adjacent emitting areas BEA, REA, GEA and WEA, and a process of forming an upper electrode 330.

The process of forming lower electrodes 310B, 310R, 310G and 310W, the process of forming the light-emitting layer 320, and the process of forming the upper electrode 330 may include a process in the same manner. For example, the lower electrodes 310B, 310R, 310G and 310W, the light-emitting layer 320, and the upper electrode 330 may be formed by a deposition process using evaporation. The process of forming the lower electrode 310B, 310R, 310G and 310W, the process of forming the light-emitting layer 320, and the process of forming the upper electrode 330 may be performed while maintaining a vacuum state in single process chamber.

Accordingly, the display device may increase the overall production efficiency by greatly reducing the time required for forming the light-emitting structures with improving the resolution by reducing the non-emitting area between the adjacent emitting areas BEA, REA, GEA and WEA.

The display device may light-emitting structures which are sufficiently insulated even at a horizontal distance lower than the minimum insulating distance. Thus, in the display device, the size and the area of the non-emitting area may be reduced to be smaller than the minimum insulating distance between the light-emitting structures. Therefore, in the display device, the resolution may be greatly improved.

What is claimed is:

1. A display device comprising:
   a first light-emitting structure on a first emitting area of a substrate;
   a second light-emitting structure on a second emitting area adjacent the first emitting area of a substrate, the second emitting area corresponding to a color different from the first emitting area; and
   a third light-emitting structure on a third emitting area adjacent the second emitting area of the substrate, the third emitting area corresponding to a color different from the first emitting area and the second emitting area;
   wherein the second emitting area is disposed between the first emitting area and the third emitting area, wherein the first light-emitting structure includes a first lower electrode, a first light-emitting layer and a first upper electrode,
   wherein the second light-emitting structure includes a second lower electrode, a second light-emitting layer and a second upper electrode,
   wherein the third light-emitting structure includes a third lower electrode, a third light-emitting layer and a third upper electrode, and
   wherein a vertical distance between the substrate and the second lower electrode of the second light-emitting structure is different from a vertical distance between the substrate and the first lower electrode of the first light-emitting structure.

2. The display device according to claim 1, wherein a thickness of the second light-emitting structure is substantially same as a thickness of the first light-emitting structure.

3. The display device according to claim 1,
   wherein a vertical distance between the substrate and the third lower electrode of the third light-emitting structure is substantially same as the vertical distance between the substrate and the first lower electrode of the first light-emitting structure.

4. The display device according to claim 1, further comprising:
   a lower insulating layer between the substrate and the first light-emitting structure, the lower insulating layer extending between the lower substrate and the second light-emitting structure; and
   an upper insulating layer between the insulating layer and the second light-emitting structure.

5. The display device according to claim 4, wherein the upper insulating layer includes a material different from the lower insulating layer.

6. The display device according to claim 4, wherein the lower insulating layer includes a first lower contact hole and a second lower contact hole,
   wherein a lower electrode of the first light-emitting structure extends into the first lower contact hole of the lower insulating layer, and a lower electrode of the second light-emitting structure extends into the second lower contact hole, and
   wherein a size of the second lower contact hole at an upper surface of the lower insulating layer is larger than a size of the first lower contact hole at the upper surface of the lower insulating layer.

7. The display device according to claim 6, wherein the upper insulating layer covers an edge of the lower electrode of the first light-emitting structure.

8. The display device according to claim 6, wherein the upper insulating layer extends into the second lower contact hole.

9. The display device according to claim 8, wherein the upper insulating layer includes an upper contact hole filled by the lower electrode of the second light-emitting structure, and
   wherein the upper contact hole is aligned to the second lower contact hole.

10. The display device according to claim 9, the second lower electrode is spaced apart from the first lower electrode, and the second light-emitting layer is spaced apart from the first light-emitting layer.

11. The display device according to claim 1, wherein a vertical distance between the substrate and the second lower electrode of the second light-emitting structure is larger than a vertical distance between the substrate and the first lower electrode of the first light-emitting structure.

12. A display device comprising:
    a lower over-coat layer on a substrate;
    a first light-emitting structure on the lower over-coat layer, the first light-emitting structure being spaced apart from each other;
    an upper over-coat layer between the first light-emitting structure; and
    second light-emitting structure on the upper over-coat layer,
    wherein each of the first light-emitting structure includes a first lower electrode, a first light-emitting layer and a first upper electrode,
    wherein each of the second light-emitting structure includes a second lower electrode, a second light-emitting layer and a second upper electrode, and
    wherein the second lower electrode is made of a same material as the first lower electrode, the second light-emitting layer is made of a same material as the first light-emitting layer, and the second upper electrode is made of a same material as the first upper electrode.

13. The display device according to claim 12, wherein the upper over-coat layer includes a same material as the lower over-coat layer.

14. The display device according to claim 12, wherein a side of the upper over-coat layer has a reverse taper.

15. The display device according to claim 14, further comprising:
    a first penetrating hole overlapping with the first light-emitting structure, the first penetrating hole penetrating the lower over-coat layer; and
    a second penetrating hole overlapping with the second light-emitting structure, the second penetrating hole penetrating the lower over-coat layer and the upper over-coat layer,
    wherein the first penetrating hole and the second penetrating hole are reverse tapered.

16. The display device according to claim 15, further comprising:
    a first intermediate insulating layer at the inside of the first penetrating hole, the intermediate insulating layer including a first contact hole; and
    a second intermediate insulating layer at the inside of the second penetrating hole, the second intermediate insulating layer including a second contact hole,
    wherein a side of the first contact hole and a side of the second contact hole include a positive taper.

17. The display device according to claim 15, wherein a vertical distance between the substrate and the second lower electrode of the second light-emitting device is larger than a vertical distance between the substrate and the first lower electrode of the first light-emitting device.

18. A display device comprising:
a substrate;
a first light-emitting device for producing a first color;
a second light-emitting device for producing a second color;
an insulating structure between the first light-emitting device and the second light-emitting device;
a third light-emitting device on the insulating structure, the third light-emitting device producing a third color different than the first color and the second color; and
an insulating layer on the substrate and below the first, second, and third light-emitting devices
wherein the first light-emitting device includes a first lower electrode, a first light-emitting layer and a first upper electrode,
wherein the second light-emitting device includes a second lower electrode, a second light-emitting layer and a second upper electrode,
wherein the third light-emitting device includes a third lower electrode, a third light-emitting layer and a third upper electrode, and
wherein a vertical distance between the substrate and the second lower electrode of the second light-emitting device is different from a vertical distance between the substrate and the first lower electrode of the first light-emitting device.

19. The display device of claim 18:
wherein the first light-emitting device includes a first lower electrode on the insulating layer;
wherein the third light-emitting device includes a third lower electrode on the insulating structure; and
wherein an upper surface of the first lower electrode is closer to an upper surface of the substrate than an upper surface of the third lower electrode.

20. The display device of claim 18,
wherein the first light-emitting device includes a first lower electrode on the insulating layer;
wherein the second light-emitting device includes a second lower electrode on the insulating layer; and
wherein a distance between an upper surface of the first lower electrode and an upper surface of the substrate is substantially same as a distance between an upper surface of the second lower electrode and the upper surface of the substrate.

* * * * *